(12) United States Patent
Nastasi et al.

(10) Patent No.: US 7,218,122 B1
(45) Date of Patent: May 15, 2007

(54) POWER DISTURBANCE GENERATOR

(75) Inventors: Doni J. Nastasi, Knoxville, TN (US);
Scott D. Bunton, Powell, TN (US)

(73) Assignee: Electric Power Research Institute,
Palo Alto, CA (US)

( * ) Notice: Subject to any disclaimer, the term of this patent is extended or adjusted under 35 U.S.C. 154(b) by 0 days.

(21) Appl. No.: 11/067,820

(22) Filed: Feb. 28, 2005

(51) Int. Cl.
*G01R 23/20* (2006.01)
(52) U.S. Cl. .............. 324/620; 324/613; 324/107; 324/603
(58) Field of Classification Search ........ 324/527, 324/523, 102, 620, 613
See application file for complete search history.

(56) References Cited

U.S. PATENT DOCUMENTS

| | | | |
|---|---|---|---|
| 3,569,829 A | 3/1971 | Griffey | |
| 4,720,776 A * | 1/1988 | Guyeska et al. | 363/37 |
| 5,465,050 A * | 11/1995 | Marinelli et al. | 324/613 |
| 5,886,429 A * | 3/1999 | Grady et al. | 307/125 |
| 5,920,132 A * | 7/1999 | Rockfield et al. | 307/130 |
| 6,285,169 B1 * | 9/2001 | McEachern | 323/209 |
| 6,559,562 B1 * | 5/2003 | Rostron | 307/130 |
| 6,759,765 B2 * | 7/2004 | McEachern et al. | 307/103 |

FOREIGN PATENT DOCUMENTS

WO    WO 00/60430    10/2000

\* cited by examiner

*Primary Examiner*—Anjan Deb
(74) *Attorney, Agent, or Firm*—Luedeka, Neely & Graham, PC

(57) ABSTRACT

An apparatus selectively generates a disturbance in a three-phase supply voltage provided to a load. The apparatus includes input connections for receiving a first phase voltage, a second phase voltage and a third phase voltage of the three-phase supply voltage. The apparatus includes a voltage disturbance generator for selectively adjusting the amplitudes of the first, second and third phase voltages according to a first test method, a second test method or a third test method. Output connections are provided for connecting to the load to provide the load the first, second and third phase voltages as altered according to the first, second or third test method. In the first test method, a phase-to-phase voltage disturbance is introduced between the first and second phase voltages by altering the amplitude of the first phase voltage against the second phase voltage. In the second test method, a phase-to-phase voltage disturbance is introduced between the first and second phase voltages by altering the amplitudes of the first and second phase voltages in reference to each other. In the third test method, a phase-to-phase voltage disturbance is introduced between the first and second phase voltages by altering the amplitude of the first and second phase voltages in reference to a neutral connection. The apparatus provides for selecting the first, second or third test method without disconnecting any of the first, second and third phase voltages from the input connections, without disconnecting the load from any of the output connections, and without interrupting the load.

23 Claims, 17 Drawing Sheets

Fig. 10

POWER DISTURBANCE GENERATOR

FIELD

This invention relates to the field of power disturbance generators. More particularly the invention relates to a voltage sag/swell generator for use in testing of loads, such as automated process equipment in a manufacturing plant.

BACKGROUND

In most cases, machines and components used in performing industrial processes receive power from public utility companies. Unfortunately, power supplied by utility companies is often subject to transient reductions in voltage level (sags) or increases in voltage level (swells). These sags and swells can have deleterious effects on sensitive industrial processes.

Sag/swell generators are devices that are typically placed in the power circuit between a power supply and a load to introduce controlled and repeatable voltage sags or swells. Using these generators, engineers can perform tests to observe the effects of voltage sags and swells on industrial machines and processes. Using information gathered during such tests, the engineers can determine ways to adjust the machines and processes to minimize harmful effects of voltage variations.

The usefulness of prior voltage sag/swell generators has been limited because they have not provided test engineers the ability to easily select between different modes of generating a voltage sag or swell using a single generator. For example, if a test engineer wished to do a first test wherein a voltage sag in a three-phase power system is described by a reduction in amplitude of a single phase-to-neutral voltage (simulating a line-to-ground fault on the utility system), and then do a second test wherein the sag is described by a phase-to-phase reduction (simulating two overhead distribution lines coming into contact with one another), those tests would have to be performed using different sag generators. This is inconvenient due to the time and effort involved in setting up two different generators. The cost in providing two sag generators can also be significant.

What is needed, therefore, is a sag/swell generator having multiple modes of operation whereby the amplitude and phase relationships of each phase in a three-phase system is selectable by the test personnel.

SUMMARY

The invention provides a portable voltage disturbance generator combined with a built-in data acquisition system. The invention serves as a diagnostic tool for determining ride-through characteristics of industrial processes and machinery when those processes are subjected to disturbances in power line voltage. With the invention connected in series between the voltage supply and the load, the user can induce voltage disturbances of controlled amplitude and duration, or turn the supply voltage off momentarily, while monitoring voltages, currents, or other signals from within the process. This allows investigators to quickly identify vulnerable process components. The invention allows the investigators to easily choose between three different methods for simulating a voltage disturbance in a three-phase power system. The method selected will depend upon the type of supply voltage disturbance that the investigators wish to simulate. Once the investigators have identified the weak links in process components, it is often possible to apply local ride-through solutions that are much more economical than whole-system power conditioning. Some typical industrial process components to monitor during a voltage disturbance event include DC power supplies, relays, contactors, and load currents.

A preferred embodiment of the invention is controlled by a laptop computer running graphical user interface software based on a Windows or equivalent operating system. The invention creates voltage disturbances by switching rapidly between nominal supply voltage and a reduced or increased voltage. The reduced or increased voltage is preferably supplied by variable autotransformers that have been adjusted to the desired percentage of nominal voltage. The transfer from the nominal voltage to the decreased or increased voltage and back to nominal is performed by solid-state switches, such as Insulated Gate Bipolar Transistors (IGBTs), that are synchronized with precise timing signals. IGBTs offer important advantages over other types of switches and provide a very fast, uninterrupted transition between the two voltage levels.

In a preferred embodiment, the system is equipped with sixteen data acquisition channels for monitoring responses of process components during voltage disturbances. Preferably, eight of the sixteen channels are low-voltage channels that are ideal for use with current probes or other sensors, while the other eight are isolated, high-voltage channels provided for direct connection to the equipment under test.

According to one preferred embodiment, the invention provides an apparatus for selectively generating a disturbance in a three-phase supply voltage provided to a load. The apparatus includes input connections for receiving a first phase voltage, a second phase voltage and a third phase voltage of the three-phase supply voltage. The apparatus includes a voltage disturbance generator for receiving the first, second and third phase voltages and selectively adjusting the amplitudes of the first, second and third phase voltages according to a first test method, a second test method or a third test method. The apparatus has output connections for connecting to the load to provide to the load the first, second and third phase voltages as altered according to the first, second or third test method.

In the first test method, a phase-to-phase voltage disturbance is introduced between the first and second phase voltages by altering the amplitude of the first phase voltage against the second phase voltage. In the second test method, a phase-to-phase voltage disturbance is introduced between the first and second phase voltages by altering equally the amplitudes of the first and second phase voltages with respect to each other. In the third test method, a phase-to-phase voltage disturbance is introduced between the first and second phase voltages by altering the amplitudes of the first and second phase voltages in reference to a neutral connection. Alternatively in the third test method, a phase-to-phase disturbance is introduced between the first and second phase voltages by altering the amplitude of only the first or second phase voltage with respect to a neutral connection. The third test method is versatile because it additionally allows simultaneous three-phase sags in a balanced or unbalanced configuration.

In this preferred embodiment, the apparatus provides for selecting the first, second or third test method without disconnecting any of the first, second and third phase voltages from the input connections, without disconnecting the load from any of the output connections, and without interrupting the load.

In one embodiment, the invention provides an apparatus for selectively generating a disturbance in a three-phase supply voltage provided to a load during a test. The apparatus of this embodiment includes input connections, a voltage disturbance generator, output connections and a neutral connection. The input connections include first, second and third input connections for connecting to the three-phase supply and receiving first, second and third phase voltages, respectively. The output connections include first, second and third output connections for connecting to the load and providing to the load the first, second and third phase voltages, respectively, as altered according to the test.

The voltage disturbance generator receives the first, second and third phase voltages from the input connections and selectively adjusts the amplitudes of the first, second and third phase voltages according to a particular test method. The voltage disturbance generator of this embodiment includes a first transformer and a second transformer. When configured according to the particular test method, the first transformer has a first winding connection connected to the first input connection, a second winding connection connected to the second input connection, a first tap connection connected to the first output connection, a second tap connection connected to the second output connection, and a center tap available for connection to the neutral connection. When configured according to the particular test method, the second transformer provides a third winding connection connected to the third input connection, a fourth winding connection connected to the neutral connection, and a third tap connection connected to the third output connection.

Also in a preferred embodiment, the invention provides a voltage disturbance generator for receiving a supply voltage from an input connection and for selectively adjusting the amplitude of the supply voltage to be provided to an output connection. The voltage disturbance generator of this embodiment includes at least one voltage switching network. The voltage switching network comprises a first switching device, a bridge rectifier circuit, a bipolarized protection component, and a unipolarized protection component. The AC terminals of the bridge rectifier circuit are connected between the input connection and the output connection. The first switching device is connected to the DC terminals of the bridge rectifier. The bipolarized protection component is connected between the input connection and the output connection for protecting the first switching device and the bridge rectifier circuit from damage due to transient voltages that naturally occur during rapid switching. The unipolarized protection component is connected across the first switching device for protecting the first switching device from damage due to transient voltages that naturally occur during rapid switching.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 10 depicts a log information screen generated by voltage disturbance test software according to a preferred embodiment of the invention.

DETAILED DESCRIPTION

Figure 1:
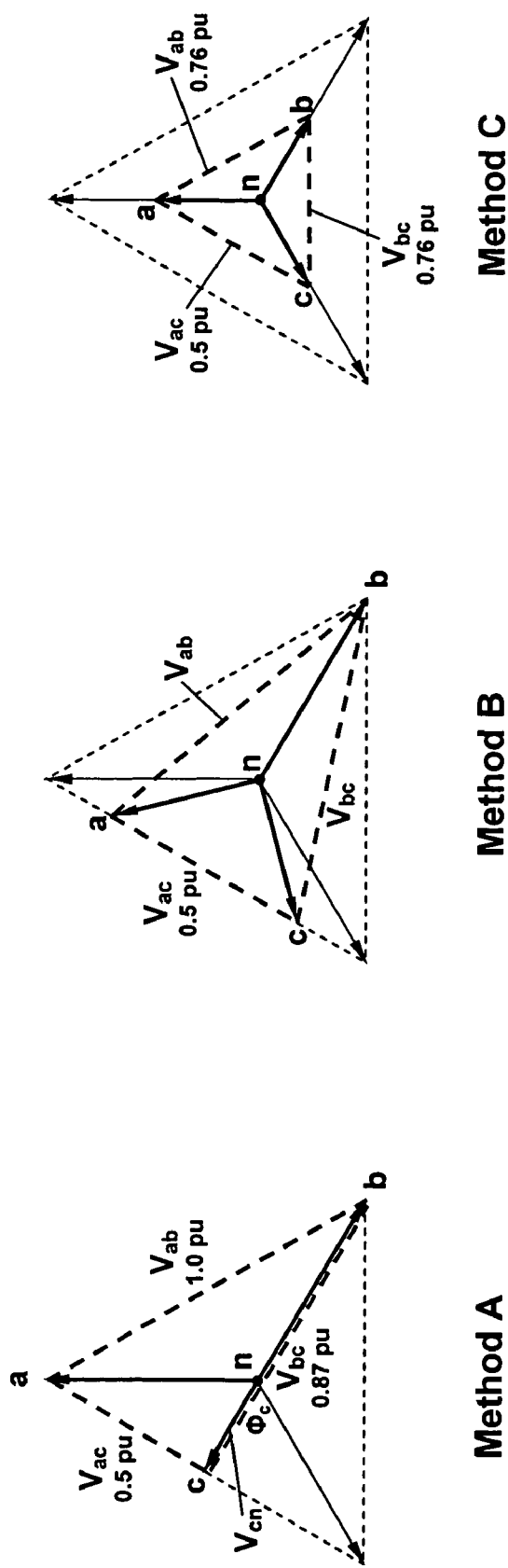
FIG. 1 depicts vector diagrams representing three methods of generating a voltage disturbance according to a preferred embodiment of the invention.

In the field of testing industrial machines and processes undergoing supply voltage disturbances, there are three generally accepted methods for simulating voltage sags or swells in a three-phase power system. Those methods, referred to herein as methods A, B and C, and also as first, second and third methods, are represented by the vector diagrams depicted in FIG. 1. It will be appreciated that each method is capable of producing a momentary voltage sag (decrease) and a momentary voltage swell (increase), although only voltage sags are represented in FIG. 1. Voltage sags and swells will be referred to herein collectively as voltage disturbances.

Generally, method A is often utilized by test personnel to introduce phase-to-phase voltage disturbances. The basic concept of method A involves injecting phase-to-phase voltage disturbances by referencing one phase against another phase. With method A, the voltage disturbance test can be performed with or without a neutral connection since the neutral is not referenced. This is illustrated in FIG. 1, which depicts a 60 degree phase shift in vector $V_{cn}$ and a 50% amplitude reduction in vector $V_{ac}$ relative to the nominal value. The nominal value for each vector is defined as 1.0 per unit (pu) for the purposes of the examples depicted in FIG. 1. For a momentary interruption between the two affected phases, method A induces a total of 120 degrees of phase shift for $V_{cn}$.

Method B creates a phase-to-phase voltage disturbance by introducing an equivalent change in voltage amplitude to two phases rather than to a single phase as in method A. As shown in FIG. 1, this balanced change results in equal phase shifts for the affected phase-to-neutral vectors. In the example of FIG. 1, there is a 50% voltage sag in the phase-to-phase voltage $V_{ac}$ relative to the nominal voltage. For a momentary interruption between the two affected phases, method B induces a total of 60 degrees of phase shift each for $V_{an}$ and $V_{cn}$. Like method A, method B does not require a neutral connection for phase-to-phase testing.

Method C creates a phase-to-phase voltage disturbance by referencing a neutral connection. In the example of FIG. 1, a 50% sag in nominal phase-to-phase voltage $V_{ac}$ is created by reducing the two phase-to-neutral voltages $V_{an}$ and $V_{cn}$ by 50% of nominal. As FIG. 1 indicates, method C induces no phase shift between the phase-to-neutral voltages during momentary disturbances. Method C requires a neutral conductor be used. Method C is versatile in that it allows simultaneous three-phase voltage disturbances in a balanced or unbalanced configuration. As discussed in more detail hereinafter, the balanced or unbalanced configuration may be attained through changing the magnitude of any phase or phases by the appropriate tap selection at the autotransformer.

Figure 2:
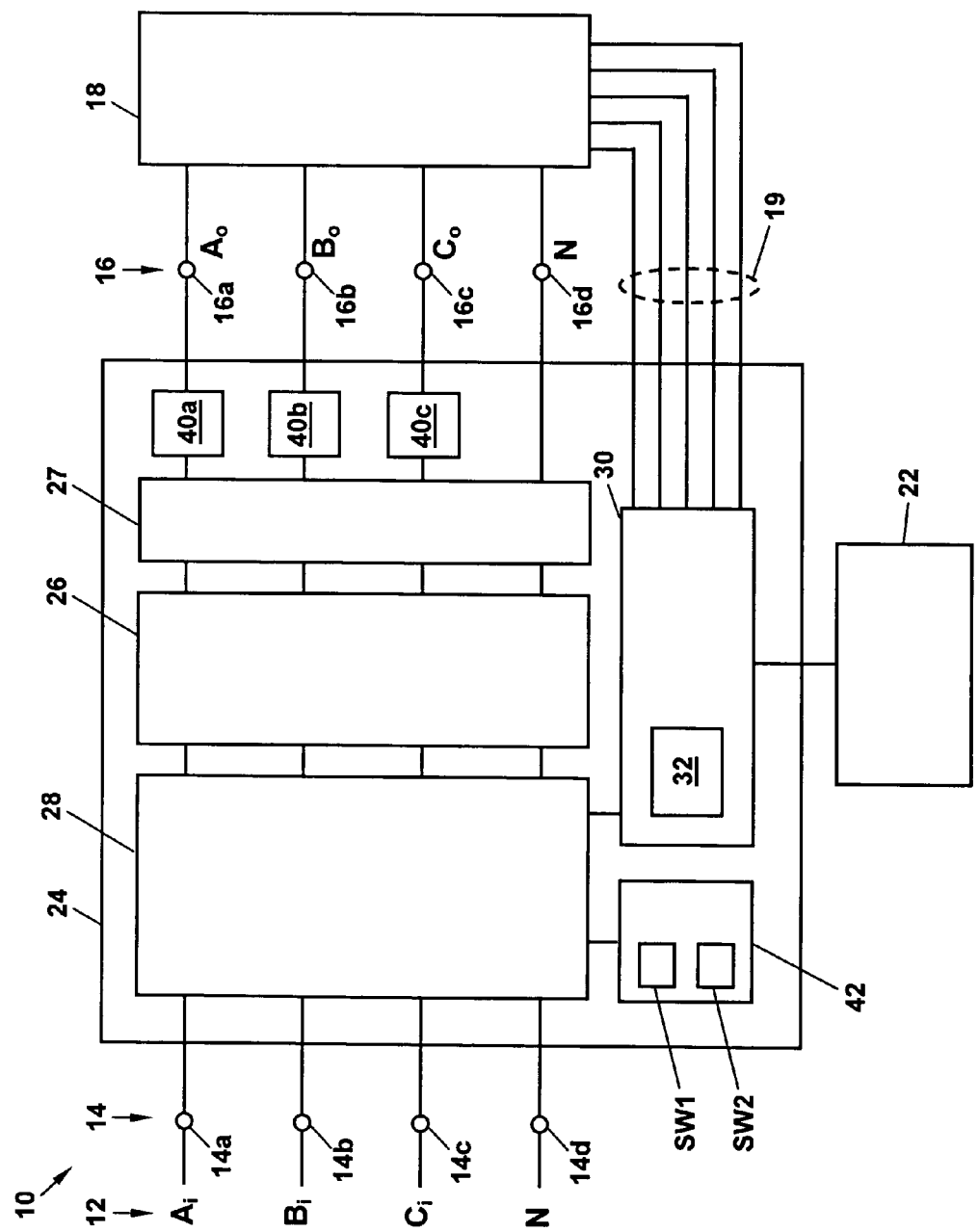
FIG. 2 depicts a functional block diagram of a voltage disturbance generator according to a preferred embodiment of the invention.

The voltage disturbance generator of the present invention offers test personnel the option of testing a load using any of methods A, B or C simply by selecting an appropriate switch setting. A test setup incorporating a preferred embodiment of the invention is depicted in FIG. 2. The test setup 10 receives a three-phase input supply voltage 12 (phase $A_i$, phase $B_i$, and phase $C_i$) such as from the electric utility grid or from a motor/generator set. The supply voltage 12 is connected to an input port 14 of a voltage disturbance generator 24. The input port 14 includes first, second and third input connections 14a–14c and a neutral connection 14d. An output port 16 of the generator 24 provides a three-phase output voltage (phase $A_o$ phase $B_o$ and phase $C_o$) to the load under test 18. The output port 16 includes first, second and third output connections 16a–16c and a neutral connection 16d.

In the preferred embodiment of the invention, the voltage disturbance generator 24 operates under the control of test software running on a control computer 22. Within the voltage disturbance generator 24 is an autotransformer network 26, a voltage switching network 27 and a mode switching network 28. As described in more detail below, the type, magnitude and duration of the voltage disturbance created by the voltage disturbance generator 24 are determined by tap settings within the autotransformer network 26, positions of manual mode selection switches SW1 and SW2 on the control panel of the generator 24 and control signals provided by the control computer 22. A preferred embodiment of the invention includes a data acquisition board 30 and controller 32 for acquiring various test signals 19 associated with the load under test 18 during a voltage disturbance test.

Figure 3A:
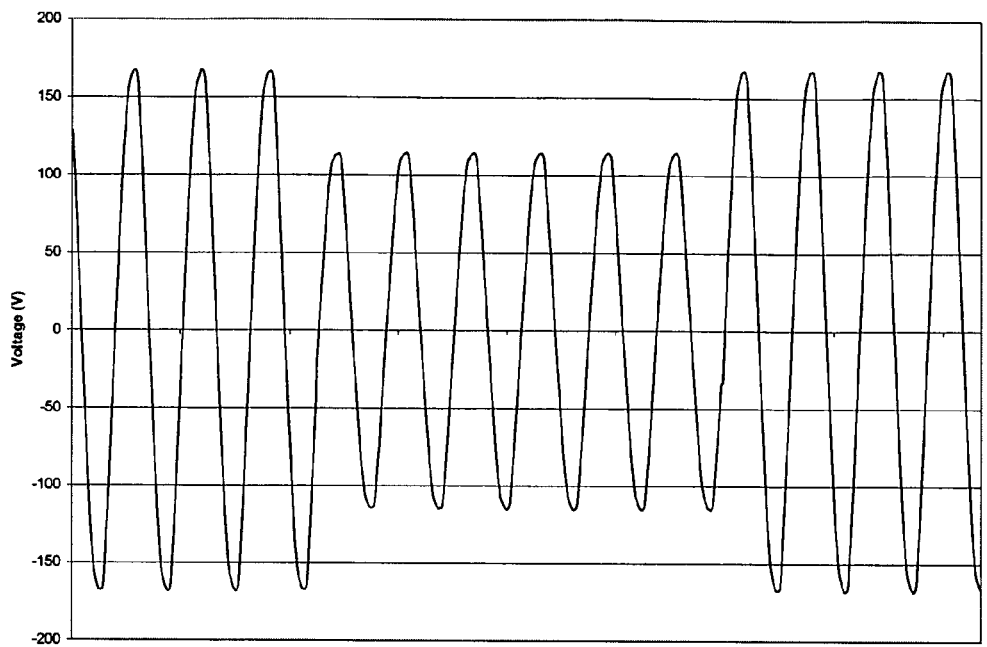
FIG. 3A depicts an example of a 6-cycle voltage sag to 70% of nominal voltage for one phase of a three-phase supply.
Figure 3B:
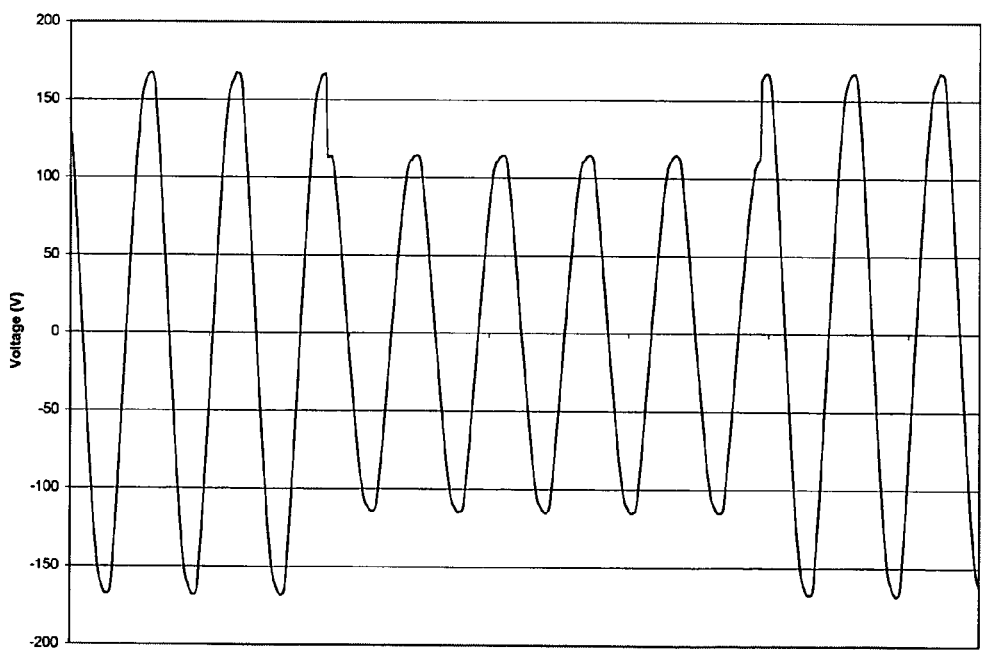
FIG. 3B depicts an example of a 5-cycle voltage sag originating at a phase angle of 90°.

FIG. 3A depicts an example of a 6-cycle voltage sag to 70% of nominal voltage for one phase of the three-phase supply. Herein, voltage sags are described as a percentage of nominal voltage. For example, if nominal voltage is 120V, and the RMS voltage during the sag is 84V, then the event is described as "a sag to 70%". As described in more detail hereinafter, using the voltage disturbance generator 24 of the present invention, test personnel have control over the point-on-wave of disturbance events. For example, FIG. 3B shows a 5-cycle voltage sag originating at 90°. As FIG. 3B indicates, the transfer time from nominal voltage to the sag voltage is nearly instantaneous.

The computer 22 used to control the voltage disturbance generator 24 is preferably a PC-based Pentium laptop computer with a Windows operating system or equivalent. Preferably, the computer 22 has a universal serial bus (USB) port for connection to the data acquisition board 30 of the generator 24. In the preferred embodiment of the invention, the controller 32 is responsible for both acquiring data and controlling the voltage switching network 27 of the voltage disturbance generator 24.

The computer 22 preferably performs at least the following functions which are described in more detail hereinafter: controls the disturbance duration; controls the phase angle at which the disturbance is applied; triggers disturbance events; displays waveform data acquired on selected data acquisition channels during the disturbance event; automatically detects a "trip" during a disturbance event; saves/recalls waveforms for further analysis; and keeps a log of disturbance test activity.

Figure 4:
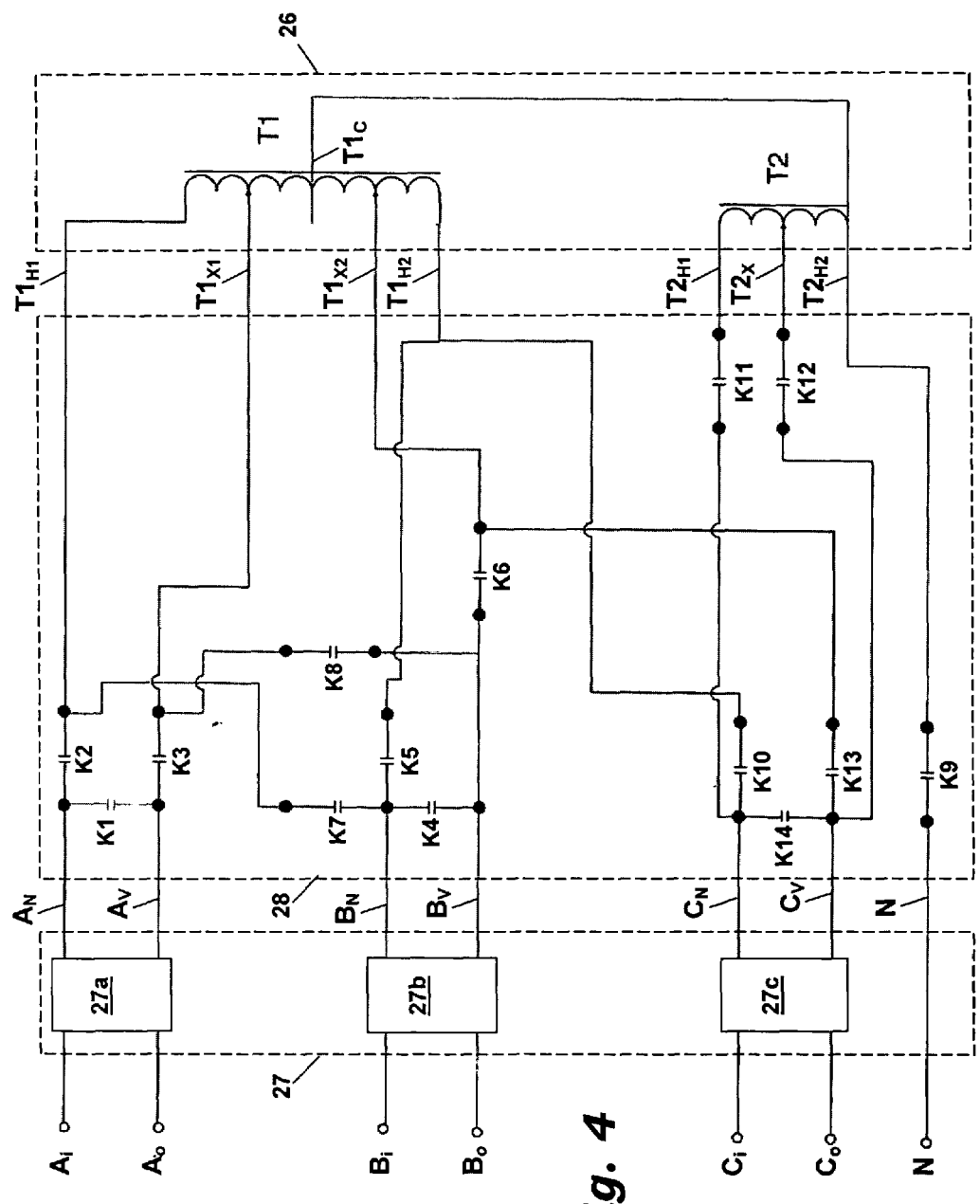
FIG. 4 depicts a mode switching network according to a preferred embodiment of the invention.

A preferred embodiment of the mode switching network 28 and the autotransformer network 26 is depicted in FIG. 4. The mode switching network 28 comprises a network of relays K1–K14 for selecting relationships between the input voltages ($A_i$, $B_i$, $C_i$,) and the output voltages ($A_o$, $B_o$, $C_o$,) based on tap positions in autotransformers T1 and T2. Transformer T1 includes winding connections $T1_{H1}$ and $T1_{H2}$, tap connections $T1_{X1}$ and $T1_{X2}$ and a center tap $T1_C$. Transformer T2 includes winding connections $T2_{H1}$ and $T2_{H2}$ and a tap connection $T2_X$.

Figure 5:
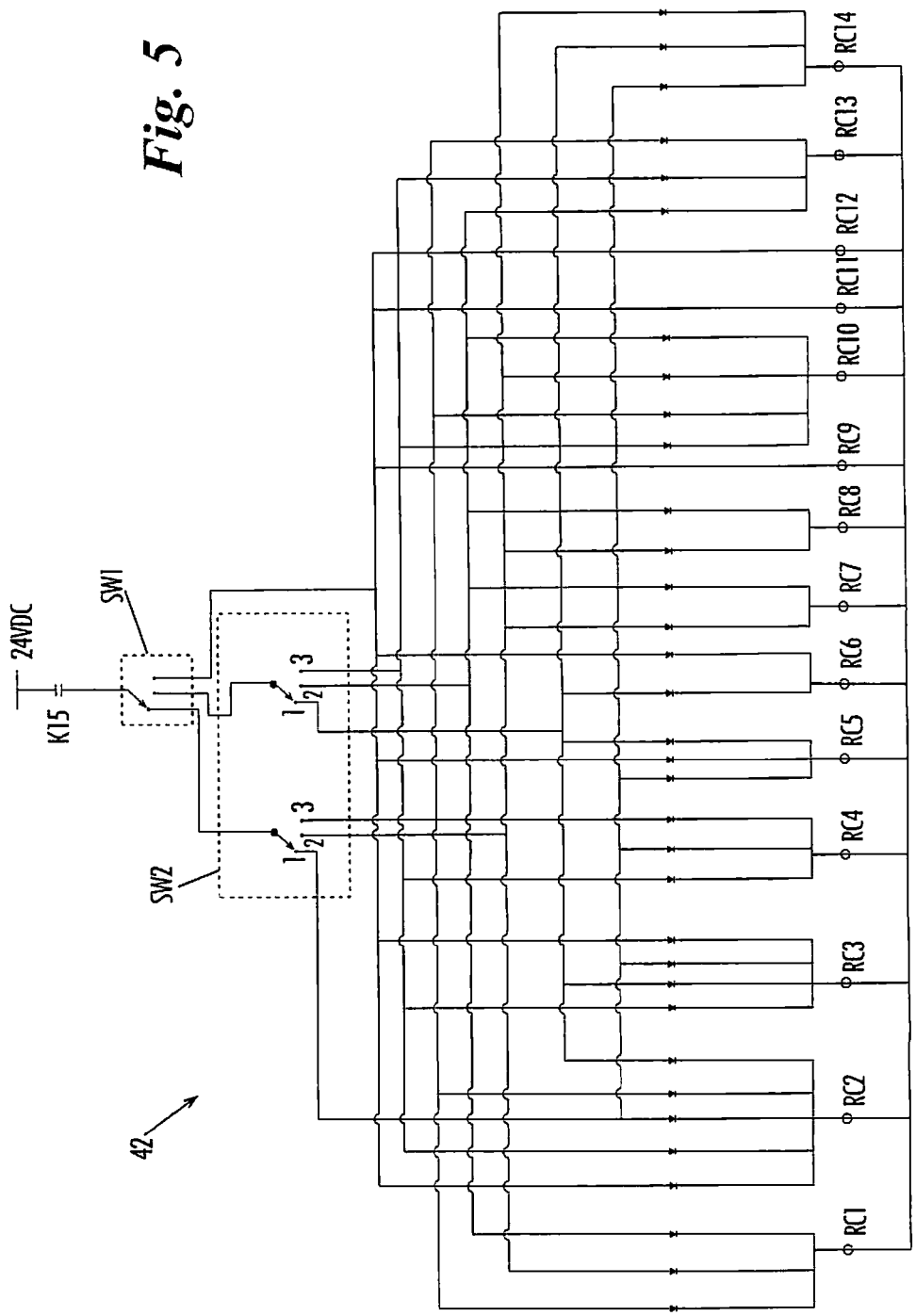
FIG. 5 depicts a relay control network according to a preferred embodiment of the invention.

The selection and activation of the relays K1–K14 are controlled by the relay control network 42, a preferred embodiment of which is depicted in FIG. 5. As shown in FIG. 5, the relay control network 42 includes a mode selection switch SW1 for selecting between test methods A, B and C. In the preferred embodiment depicted in FIG. 5, position 1 of switch SW1 selects test method A, position 2 selects method B and position 3 selects method C. When the mode selection switch SW1 is in positions 1 or 2, a phase selection switch SW2 is used to select the two phases between which a voltage disturbance is to be introduced. For example, when switch SW2 is in position 1, the disturbance is generated between phases A and B, when switch SW2 is in position 2, the disturbance is generated between phases B and C, and when switch SW2 is in position 3, the disturbance is generated between phases C and A. The combination of settings of switches SW1 and SW2 cause activation (closure) of the relays K1–K14 according to the schedule listed in Table I. In the preferred embodiment, the switches SW1 and SW2 are manual switches operated by knobs disposed on the front panel of the housing in which the voltage disturbance generator 24 is contained. However, it should be appreciated that the switches SW1 and SW2 could be relays or other electromagnetically-controlled switches activated by the controller 32 in conjunction with computer-generated commands.

TABLE I

Figure 6A:
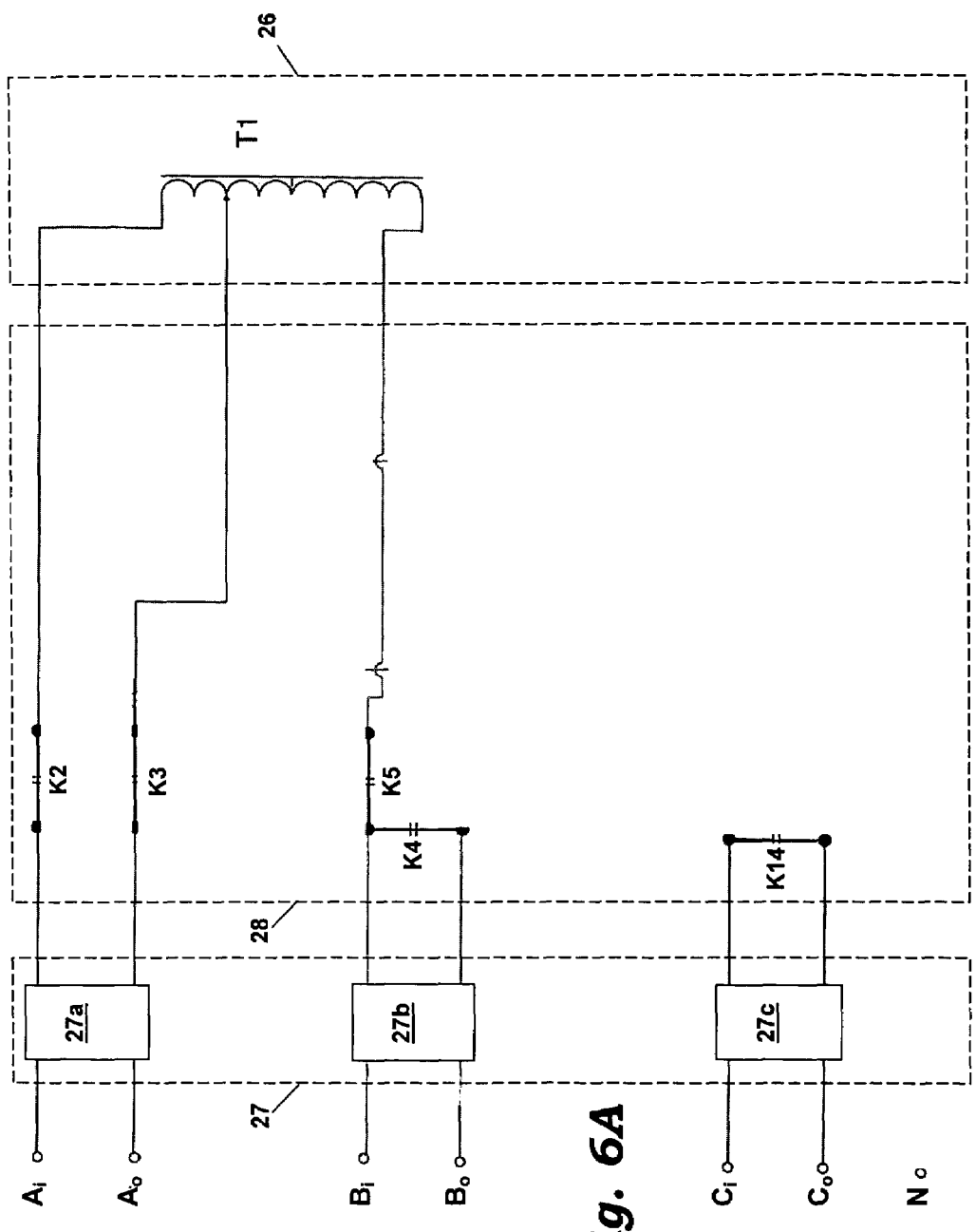
FIG. 6A depicts a preferred embodiment of the mode switching network set to introduce a voltage disturbance according to test method A between phase A and phase B.
Figure 6B:
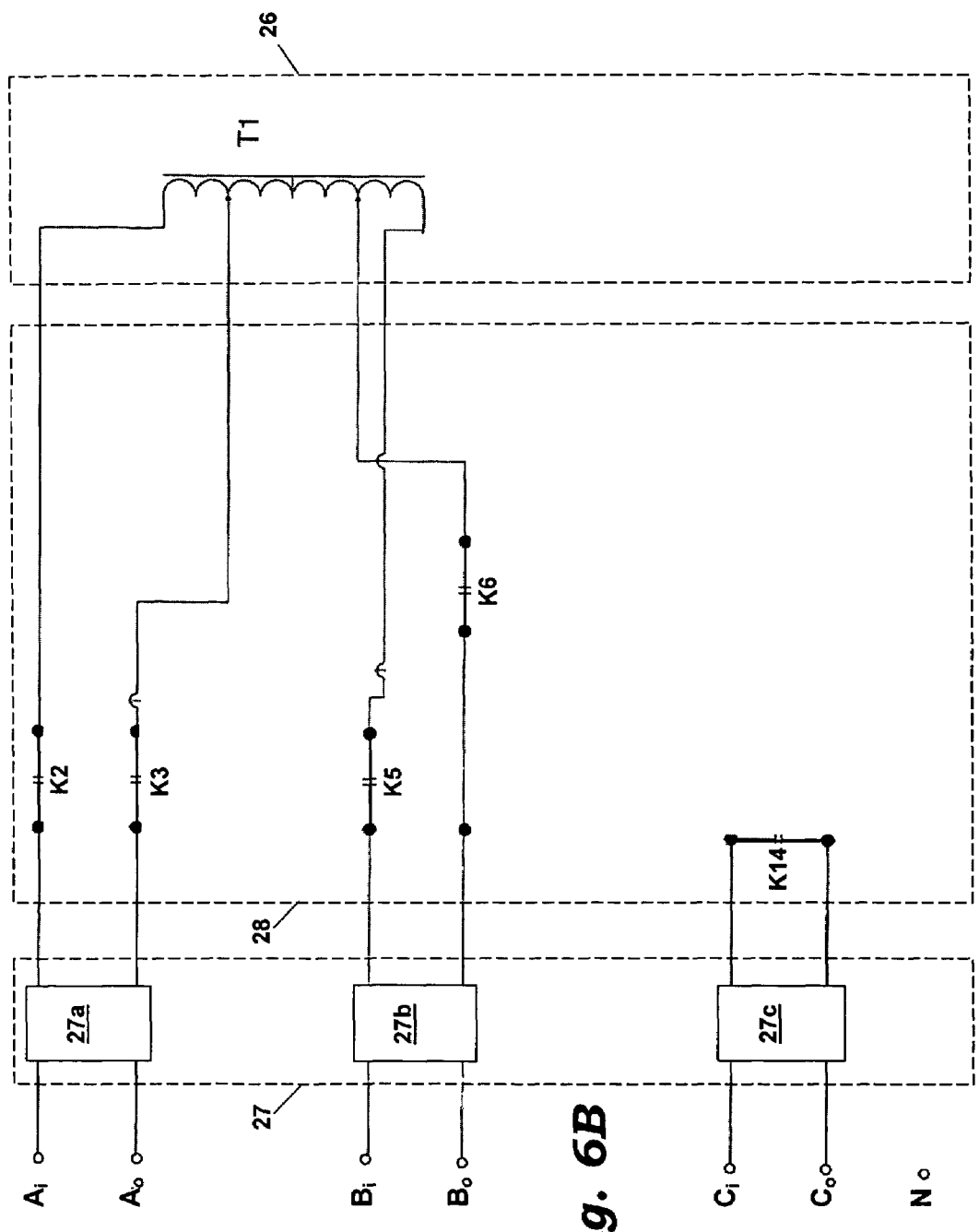
FIG. 6B depicts a preferred embodiment of the mode switching network set to introduce a voltage disturbance according to test method B between phase A and phase B.
Figure 6C:
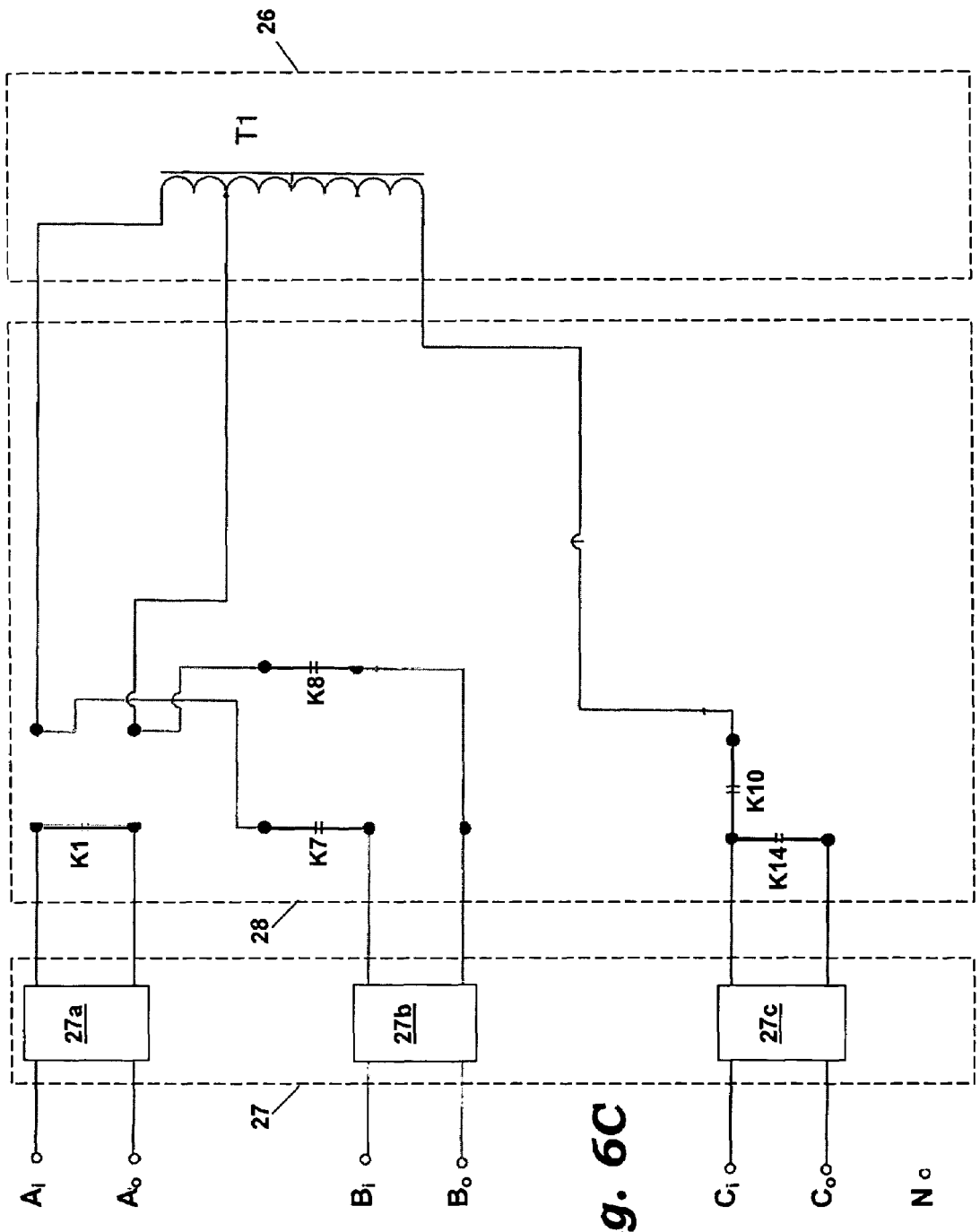
FIG. 6C depicts a preferred embodiment of the mode switching network set to introduce a voltage disturbance according to test method A between phase B and phase C.
Figure 6D:
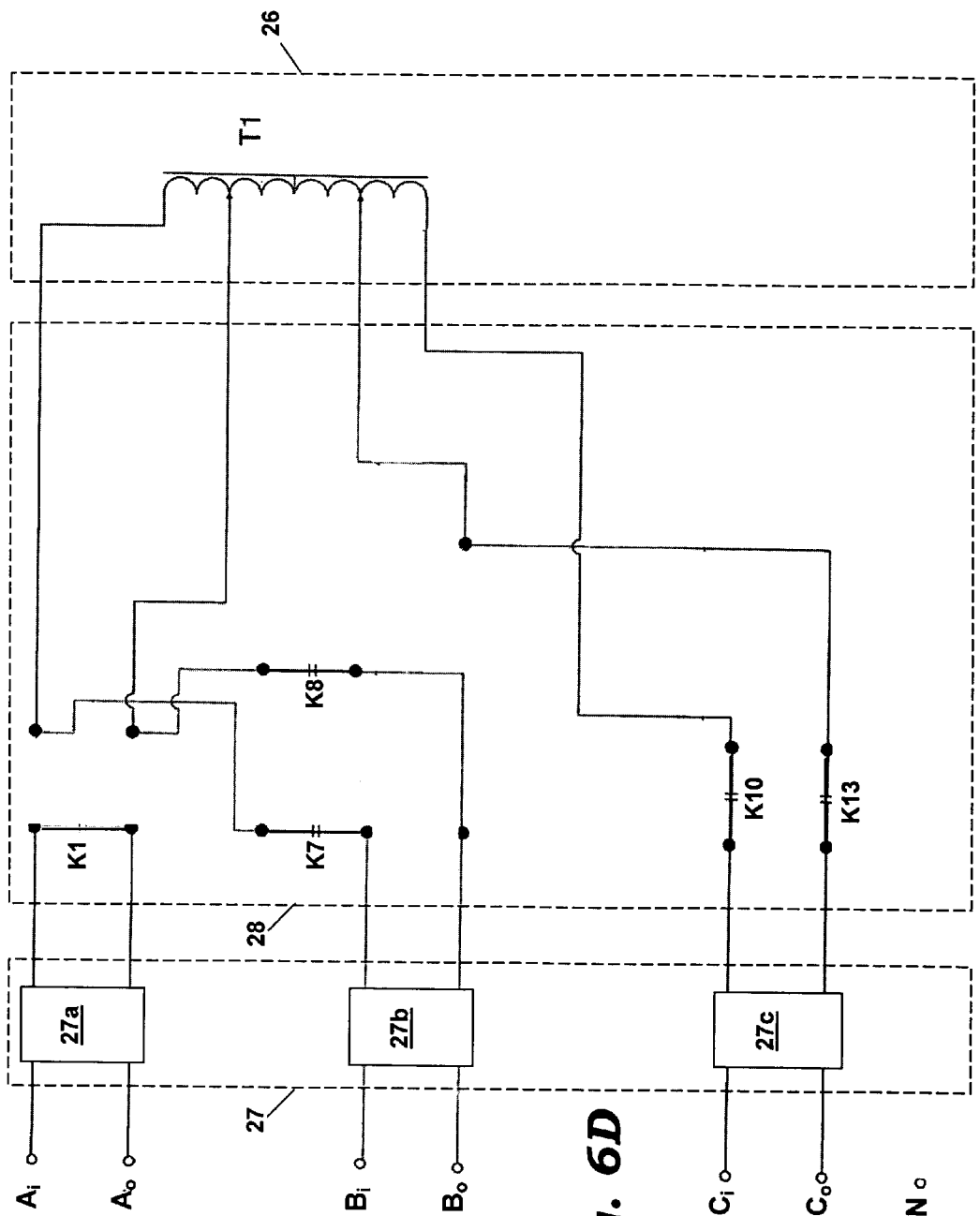
FIG. 6D depicts a preferred embodiment of the mode switching network set to introduce a voltage disturbance according to test method B between phase B and phase C.
Figure 6E:
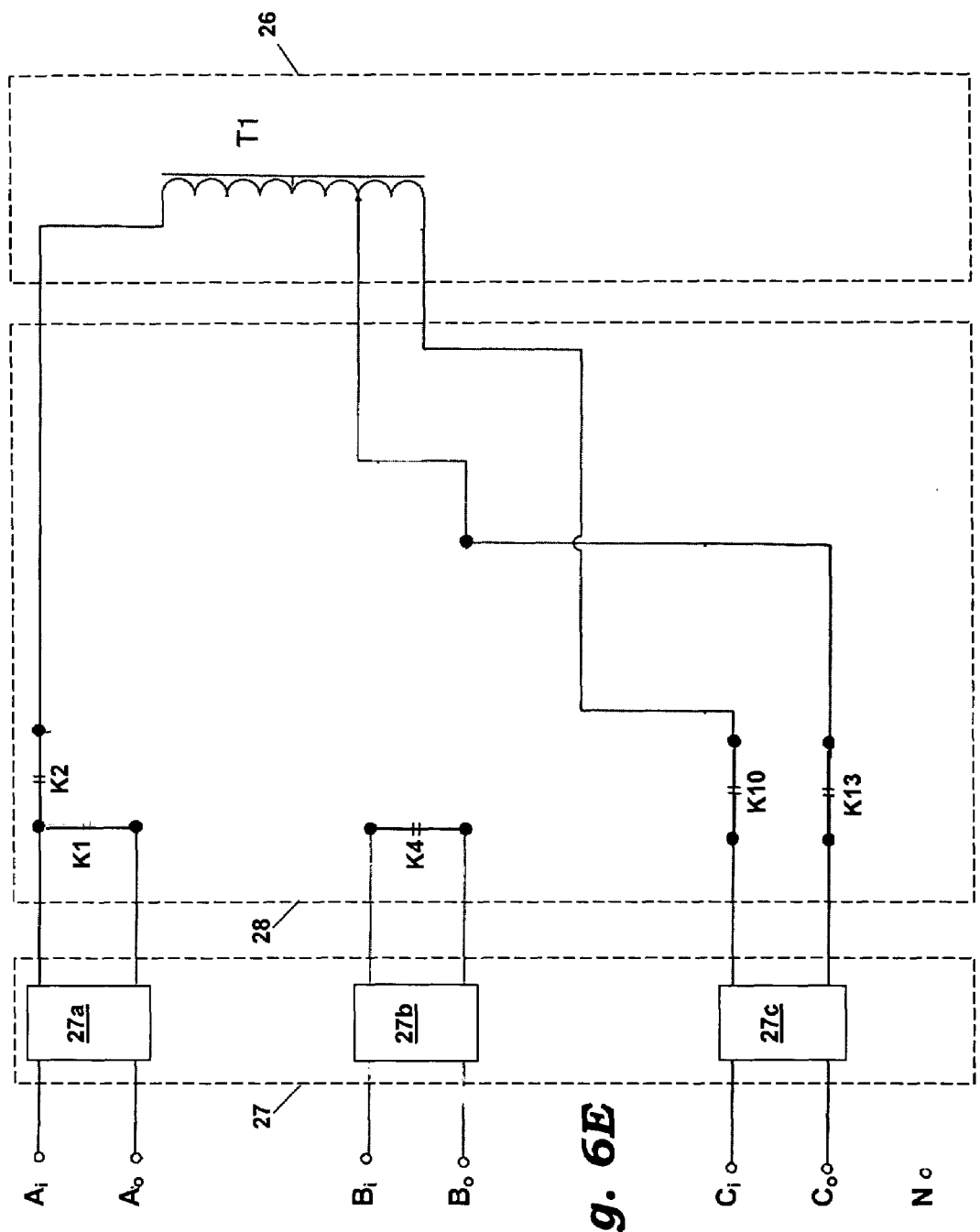
FIG. 6E depicts a preferred embodiment of the mode switching network set to introduce a voltage disturbance according to test method A between phase C and phase A.
Figure 6F:
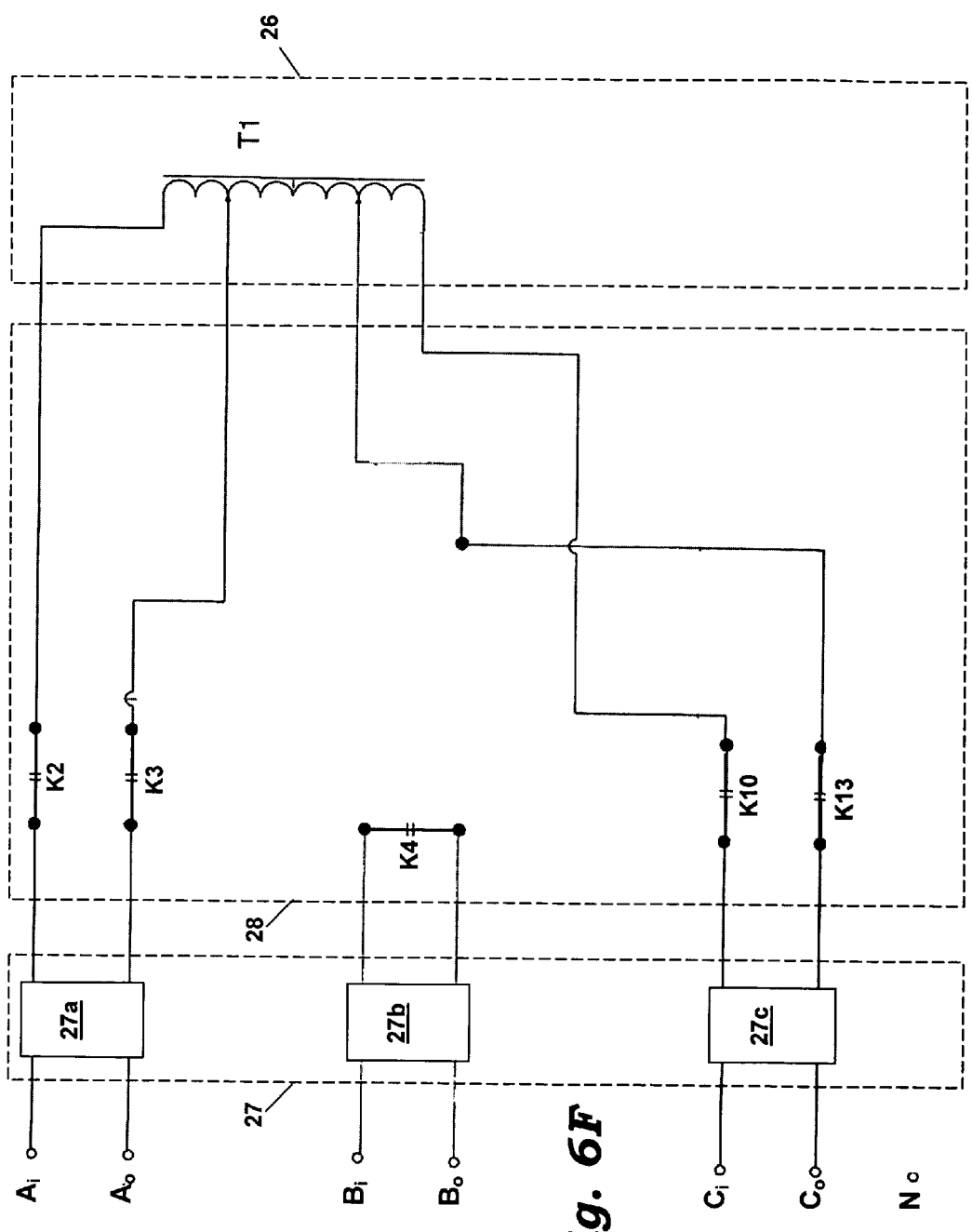
FIG. 6F depicts a preferred embodiment of the mode switching network set to introduce a voltage disturbance according to test method B between phase C and phase A.
Figure 6G:
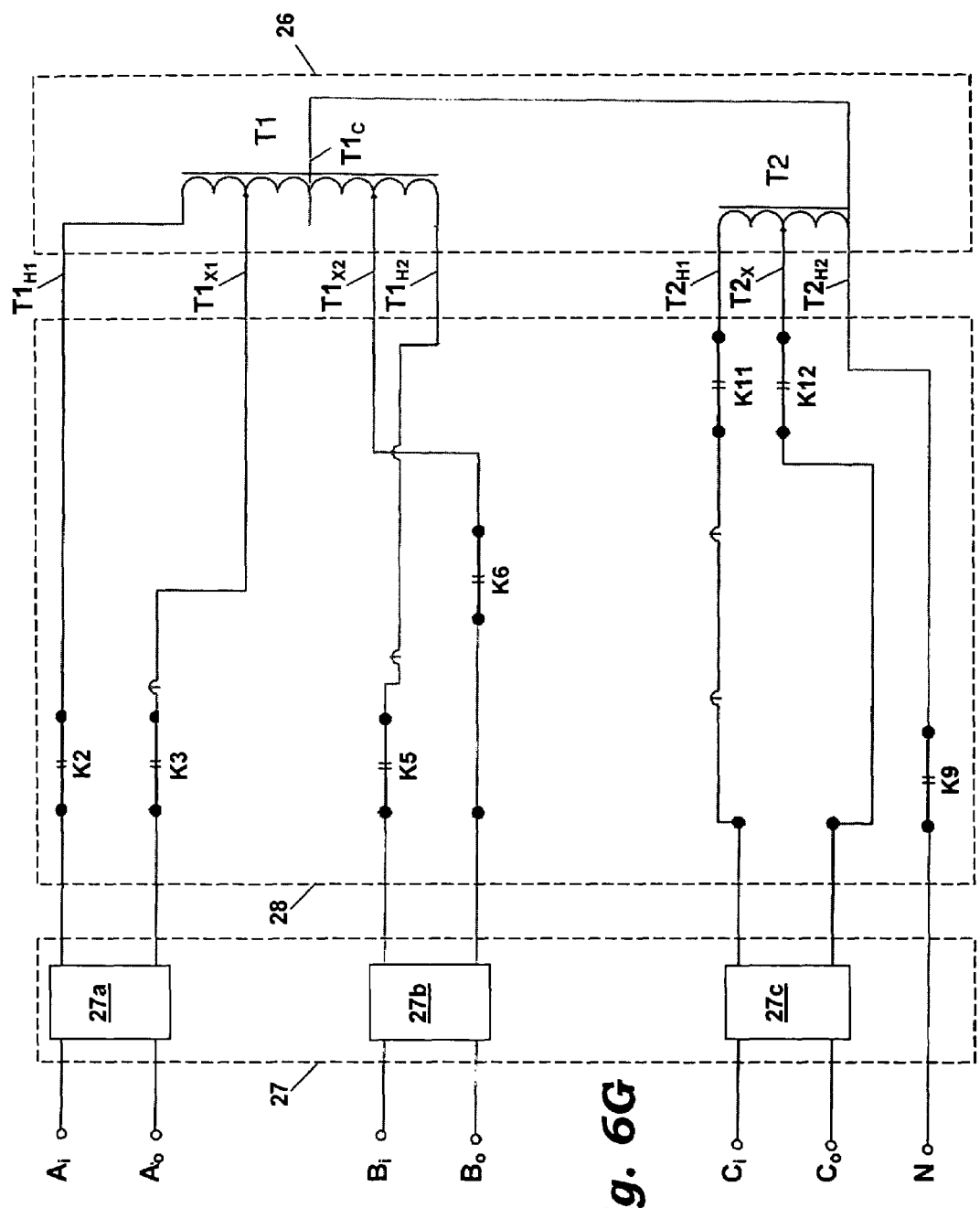
FIG. 6G depicts a preferred embodiment of the mode switching network set to introduce a voltage disturbance according to test method C for phases A, B and C in a wye configuration.

| SW1 Position | SW2 Position | Test Method | Phases | Relays Closed | Schematic Depicted in |
|---|---|---|---|---|---|
| 1 | 1 | A | A–B | K2, K3, K4, K5, K14 | FIG. 6A |
| 1 | 2 | A | B–C | K1, K7, K8, K10, K14 | FIG. 6C |
| 1 | 3 | A | C–A | K1, K2, K4, K10, K13 | FIG. 6E |
| 2 | 1 | B | A–B | K2, K3, K5, K6, K14 | FIG. 6B |
| 2 | 2 | B | B–C | K1, K7, K8, K10, K13 | FIG. 6D |
| 2 | 3 | B | C–A | K2, K3, K4, K10, K13 | FIG. 6F |
| 3 | n/a | C | A–N, B–N, C–N | K2, K3, K5, K6, K9, K11, K12 | FIG. 6G |

As indicated in Table I, FIGS. 6A–6G depict schematic diagrams of the circuits formed within the mode switching network 28 based on the corresponding relay closures listed in Table I.

Figure 7:
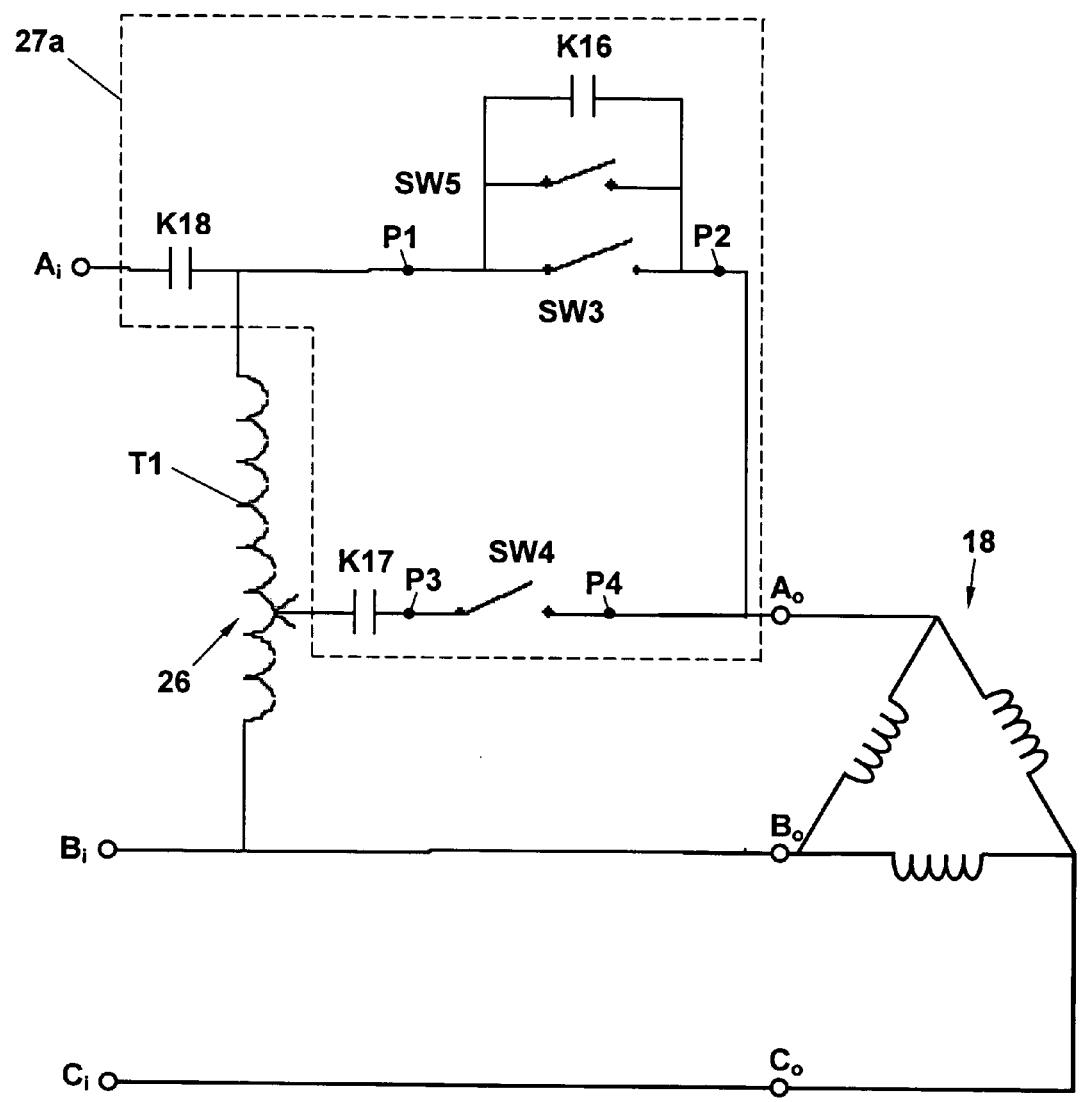
FIG. 7 depicts a voltage switching circuit of a voltage disturbance generator according to a preferred embodiment of the invention.

As depicted in FIG. 7, each voltage switching network 27a–c comprises a set of relays K18, K16 and K17, and switches SW3 and SW4, and SW5 that switch in sequence to create voltage disturbances. Although FIG. 7 depicts the voltage switching network 27a for phase A, it should be appreciated that the same switching scheme is preferably implemented in voltage switching networks 27b and 27c for phases B and C, respectively. The configuration depicted in FIG. 7 corresponds to a situation wherein switches SW1 and SW2 are both in position 1 (test method A for a voltage disturbance between phases A and B).

In the preferred embodiment of the invention, switches SW3 and SW4 are insulated gate bipolar transistors (IGBTs) and switch SW5 is a silicon controlled rectifier (SCR). The purpose of the relay K18 is to apply or remove the input voltage $A_i$ to the remainder of the switching network 27a and the autotransformer T1 either by software control or by manual load start/stop buttons. Preferably, the voltage disturbance generator 24 prohibits closure of relay K18 and application of a voltage to the load 18 until test control software is running on the computer 22. Exiting the software preferably causes relay K18 to open.

In the preferred embodiment, a bypass relay K16 remains closed until test personnel initiate a voltage disturbance using the test software. Upon the initiation of a disturbance test, relay K16 opens, thereby allowing the switches SW3, SW4 and SW5 to open and close in proper sequence and create a voltage disturbance. When the disturbance is complete, relay K16 closes again. In this manner, the relay K16 provides a bypass for the switches SW3 and SW5 so that they do not generate heat by continuously carrying load current. This eliminates the need for large heat sinks.

The relay K17 is a safety relay that disconnects the transformer's variable output voltage from the circuit when the transformer T1 is not needed. Preferably, the relay K17 operates simultaneously with relay K16, but in the opposite state.

In the preferred embodiment, the switches SW3 and SW4 can carry and switch load current up to about 200A. However, certain loads have high inrush currents when power is applied. The same inrush can also occur immediately after voltage disturbances. As mentioned above, switches SW3 and SW4 are preferably IGBT switches. Because IGBT switches generally cannot handle large pulse currents, the switch SW5 provided in parallel with the switch SW3 is preferably an SCR, which can handle inrush currents up to 2000A peak. As an additional protection feature, the preferred embodiment includes an over-current protection circuit to protect switches SW3 and SW4 from excessive inrush currents. In case of excessive inrush current, the switches SW3 and SW4 will open and the test personnel will be alerted of the condition.

Figure 11A:
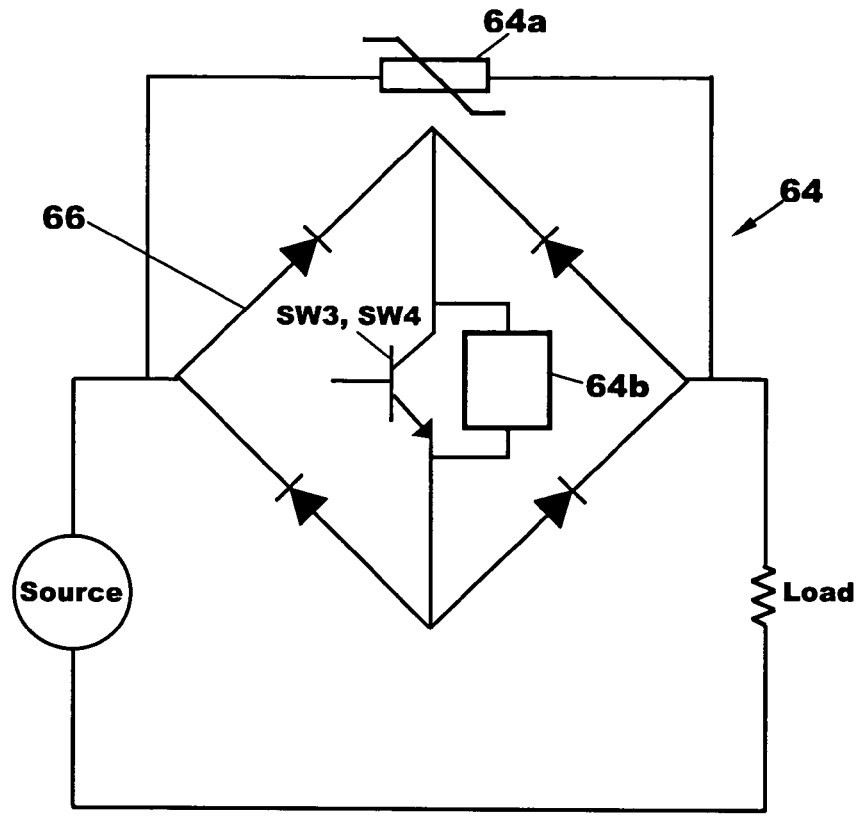
FIGS. 11A and 11B depict a snubber circuit according to a preferred embodiment of the invention.

As will be appreciated by one skilled in the art, a uni-polar switching device that conducts in only one direction (such as an IGBT) can be configured to switch alternating current (AC) in two directions with the use of a bridge rectifier circuit 66 as depicted in FIG. 11A. To avoid unnecessarily complicating FIG. 7, a bridge rectifier circuit is not depicted therein. However, it will be appreciated that in those embodiments wherein switches SW3 and SW4 are IGBT devices, a bridge rectifier circuit may be provided between points P1 and P2 for switch SW3 and between points P3 and P4 for switch SW4. In a preferred embodiment, the bridge rectifier 66 depicted in FIG. 11A comprises a SanRex DF200AA160.

Figure 11B:
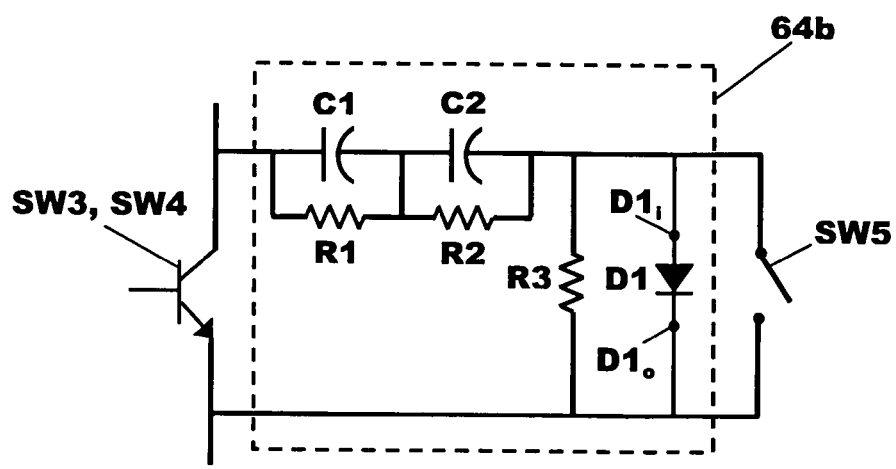

In one preferred embodiment, the voltage switching networks 27a–c include snubber circuit assemblies to protect the IGBT switches SW3 and SW4 and the bridge rectifier circuits from damage due to transient voltages. As shown in FIG. 11A, each snubber circuit assembly 64 preferably includes a bipolarized protection component 64a and a unipolarized protection component 64b. In the preferred embodiment, the bipolarized protection component 64a comprises a metal oxide varistor (MOV). Also in a preferred embodiment, the unipolarized protection component 64b comprises the snubber circuit depicted in FIG. 11B. Information regarding the components of the embodiment depicted in FIG. 11B is listed in Table II. It will be appreciated that the component information listed in Table II is provided merely as one example of an embodiment of the snubber circuit 64, and the invention is not limited to the particular component values or part numbers listed in Table II.

TABLE II

| Component | Description |
|---|---|
| SW3, SW4 | IGBT-Powerex CM400HA-24H |
| SW5 | SGR-Powerex W4DC162PB |
| 64a | MOV-Harris 575LA40 |
| D1 | RURU100120 (1200 V, 100 A)-has input port $D1_i$ and output port $D1_o$ (see FIG. 11B) |
| C1, C2 | 150 μf, 450 Vdc |
| R1, R2 | 100 kΩ, ¼ W |
| R3 | 20 Ω, 5 W |

In the preferred embodiment of the invention, the transformers T1 and T2 are multi-tapped autotransformers. Test personnel can control the magnitude of the voltage disturbance for each phase by adjusting the position of an external jumper in the variable tap of the transformers T1 and T2. In an alternative embodiment, the magnitude of the voltage disturbance may be adjusted by automated tap selection control of the controller 32 using additional contactors for the autotransformers T1 and T2 and computer-generated commands. The transformers T1 and T2 are preferably designed for voltage disturbances within the range of 0% to 125% of nominal voltage, with the taps provided in nominal voltage increments such as in 5% or 10% steps. In a preferred embodiment, the transformer T1 is rated for 600V (480V×125%) and T2 is rated for 350V (277V×125%).

As shown in FIG. 2, the preferred embodiment of the invention includes multi-function three-phase power meters 40a–c to measure characteristics of the output voltages $A_o$, $B_o$ and $C_o$ for each phase. The power meters 40a–c are preferably configured to measure the voltage resulting from the autotransformer tap settings so that test personnel have a measurement of the anticipated disturbance voltage before the disturbance event is initiated. The meters 40a–c also preferably measure load current, real power, and apparent power so that the load can be characterized before sag testing begins.

Figure 8:
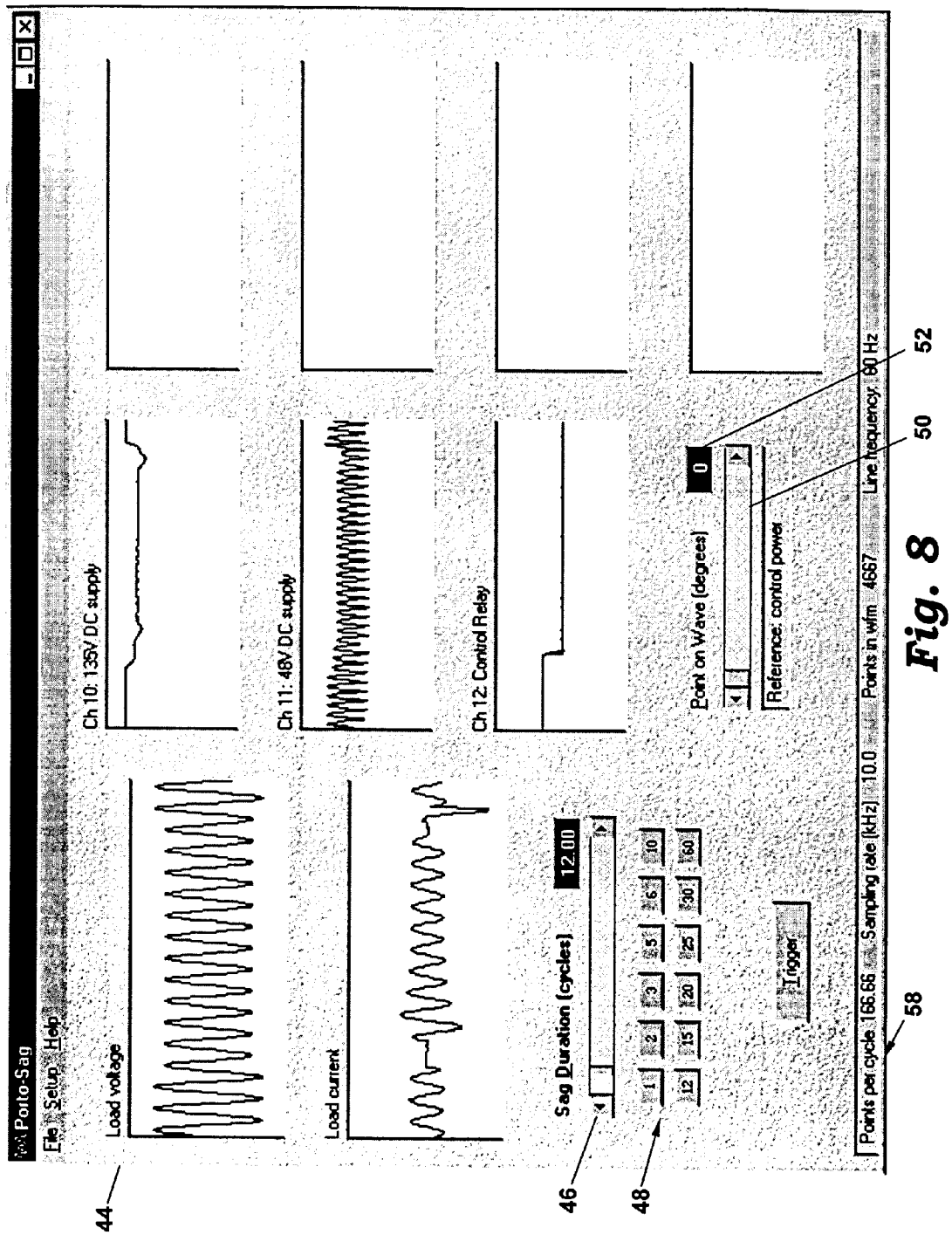
FIG. 8 depicts a test control screen generated by voltage disturbance test software according to a preferred embodiment of the invention.

In the preferred embodiment of the invention, the voltage disturbance generator 24 is controlled by a software program running in a windows-based user interface on the computer 22. An example of a main control screen 44 generated by the software on the computer 22 is depicted in FIG. 8. This screen 44 is preferably used by test personnel to initiate and control voltage disturbances. In the example of FIG. 8, the control program is set up for a twelve-cycle voltage sag triggered at 0 degrees with respect to the control power voltage. As shown in FIG. 8, the duration of the voltage disturbance is preferably controlled using a horizontal scroll bar 46. In a preferred embodiment of the invention, the duration of the voltage disturbance ranges from one quarter cycle up to three seconds in increments of one quarter cycle. In the example of FIG. 8, a set of "hot buttons" 48 are available below the scroll bar 46 to allow a quick jump to the selected disturbance duration. While these default durations are chosen because they are commonly used in disturbance testing, they may be changed simply by right-clicking on the button and typing a new value.

In the preferred embodiment of the invention, the phase angle (or point-on-wave) at which a disturbance begins is controllable between 0 and 359 degrees using a scroll bar 50 labeled "Point on Wave," or by typing a value directly into the numerical display box 52. To use this feature of the control program, an appropriate phase reference should be selected. For example, if the user is set up for three-phase tests and wishes to begin a voltage disturbance at 90 degrees, then it will be necessary to specify which phase will be at 90 degrees at the initiation of the disturbance. The other two phases will be +120 and −120 degrees out of phase at that moment. To synchronize properly, the input voltage selected as the phase reference generally must have a valid and stable signal. In the preferred embodiment of the invention, the control program automatically checks the stability of the selected input voltage and provides a message to the user if the program is unable to synchronize with the selected input voltage.

FIG. 8 also depicts multiple windows for instant display of waveforms captured during disturbances. The user may click on any of the image windows to display a larger image and to change the display characteristics, such as to include scaled axes, zoom in, measure and overlay multiple waveforms. These images may also be copied, pasted, saved and printed.

Figure 9:
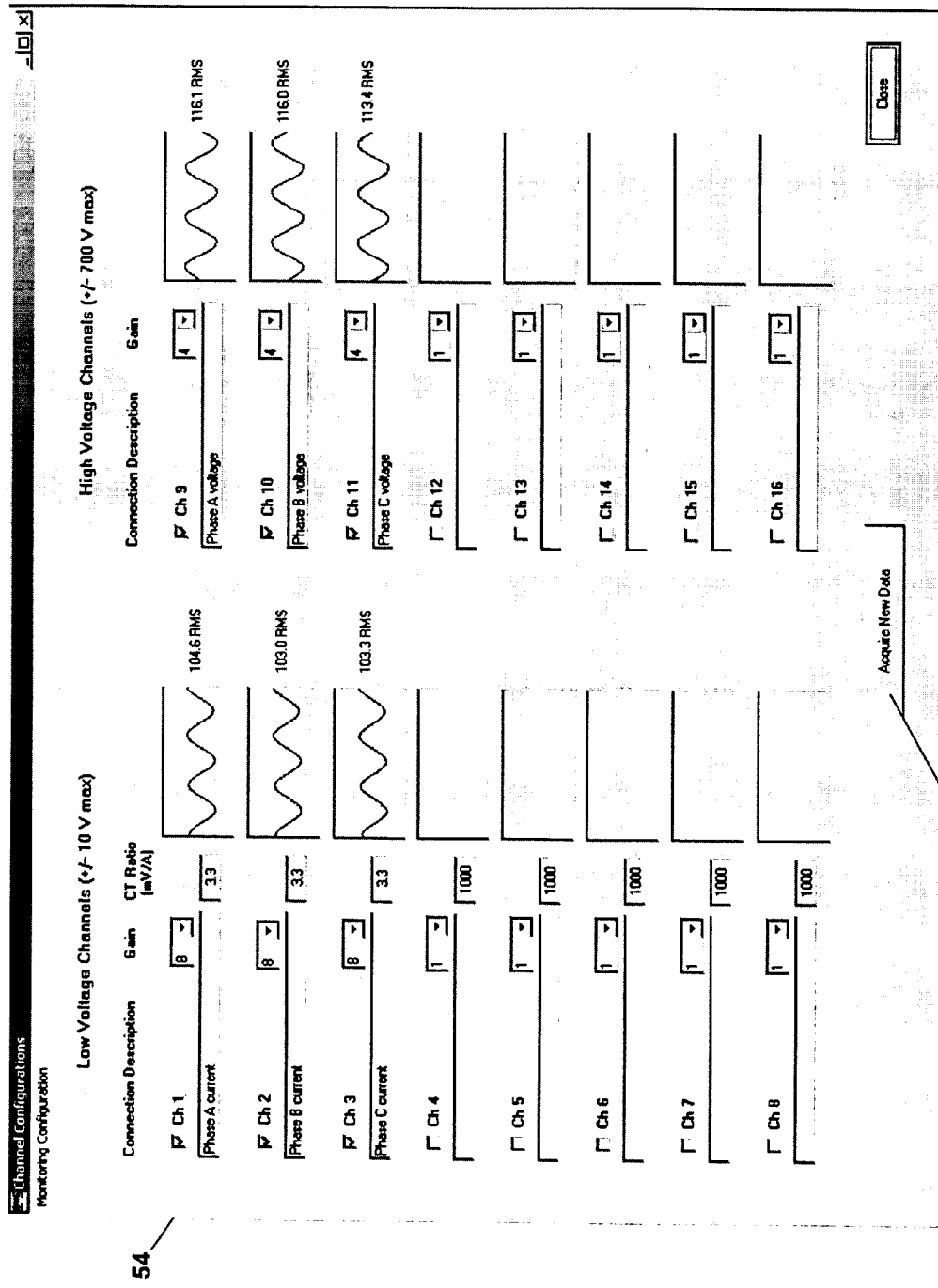
FIG. 9 depicts a data channel configuration screen generated by voltage disturbance test software according to a preferred embodiment of the invention.

FIG. 9 depicts a data channel configuration screen 54 that displays the low voltage and high voltage data acquisition channels. By clicking on "Acquire New Data", the software controls the data acquisition board 30 in taking a "snapshot" of the low and high voltage signals applied to the appropriate inputs. After acquisition of the data, the software in the preferred embodiment determines whether each input signal is AC or DC and then calculates a nominal value for each channel. Generally, this is done first when the equipment under test is operating normally so that the acquired signals are representative of a nominal operating condition. Preferably, the nominal value is stored for comparison to disturbance data as it is acquired.

In the preferred embodiment of the invention, low voltage and high voltage channels are available for a wide range of signal measuring requirements. Generally, the low voltage channels are intended for use with current probes or other transducers having output in the range of tens of millivolts to ±10 volts maximum. These low voltage channels preferably have a gain that is software selectable, and the displayed data is automatically adjusted so that the magnitude of the signal is shown relative to the input range. In many applications, the low voltage channels are used to measure current. Preferably, channels 1–3 are internally connected to measure load current on phases A, B, and C respectively. In the preferred embodiment, the high voltage channels (9–16) have an internal circuit that divides the measured voltage by a fixed ratio, and software scales the data by the same ratio in order to display a properly scaled measurement.

In the preferred embodiment, statistical information regarding the data acquisition appears at the bottom of the main control window 44, as shown in FIG. 8. For example, the points/cycle box indicates the data sample rate. Preferably, at least two sampling rates are available to the user: 10 kHz or 5 kHz.

Figure 10:
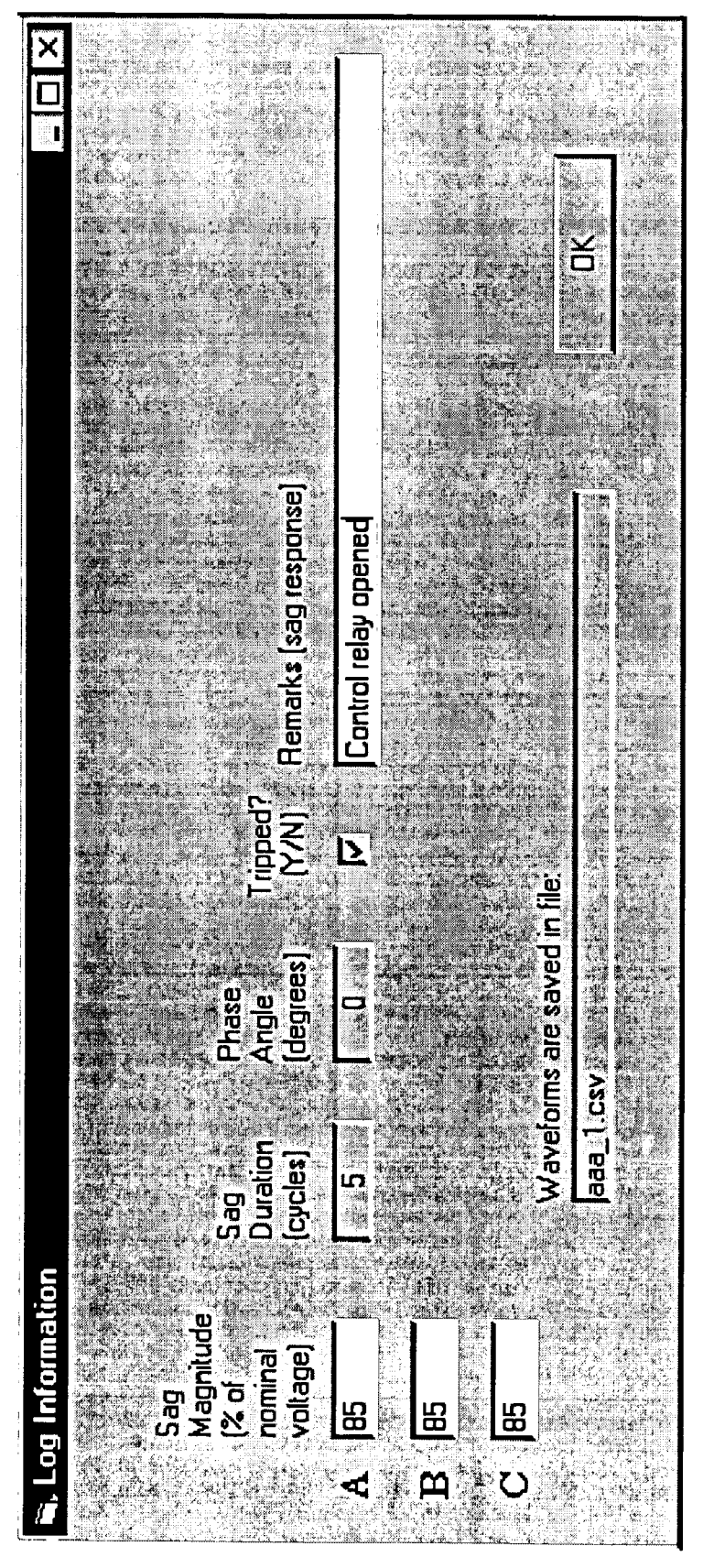

Preferably, the invention provides an on-line log that simplifies note-taking during tests by keeping a running record of disturbance test activity. In the preferred embodiment, key disturbance parameters are recorded along with data such as time, date, trip indication, a comment field, and a filename where waveforms are stored on the computer 22. When the recording log function is enabled, all waveforms are automatically stored using a numeric filename indexing system. FIG. 10 depicts an example of a display screen showing an interface that prompts a user for input to be stored in the log. In the preferred embodiment, the log file is saved as text and can be read by spreadsheet or word processing software. Waveform files are preferably stored in the same directory as the log file.

In one preferred embodiment, the invention also functions as an inrush tester for measuring inrush current when a load is started at any phase point on a supply voltage wave. In inrush test mode, the voltage disturbance is an extended interruption in the voltage, such as for one minute or longer. Power is returned at the end of the extended interruption at a particular point on the waveform. Meanwhile, the data acquisition system is preferably delayed so that data collection begins immediately prior to the power-on event. Usually, inrush current is the main parameter of interest in the data collection. However, the preferred embodiment allows the user to collect data on as many as 16 channels during the test. Preferably, an external current probe is used for this test to improve measurement accuracy.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. An apparatus for selectively generating a disturbance in a three-phase supply voltage provided to a load, the apparatus comprising:

input connections for connecting to and receiving a first phase voltage, a second phase voltage and a third phase voltage of the three-phase supply voltage;

a voltage disturbance generator for receiving the first, second and third phase voltages from the input connections and for selectively adjusting the amplitudes of one or more of the first, second and third phase voltages according to any one of a first test method, a second test method and a third test method, the voltage disturbance generator comprising:

first means for introducing a phase-to-phase voltage disturbance between the first and second phase voltages by altering the amplitude of the first phase voltage relative to the amplitude of the second phase voltage according to the first test method, second means for introducing a voltage disturbance in the first and second phase voltages by altering the amplitudes of the first and second phase voltages in reference to each other by substantially equivalent amounts according to the second test method, and third means for introducing a phase-to-phase voltage disturbance between the first and second phase voltages by altering the amplitude of the first and second phase voltages in reference to a neutral connection according to the third test method; and output connections for connecting to the load and providing to the load the first, second and third phase voltages as altered by the voltage disturbance generator, where the apparatus provides for selecting any one of the first means, second means and third means without disconnecting any of the first, second and third phase voltages from the input connections, without disconnecting the load from any of the output connections, and without interrupting the load.

2. The apparatus of claim 1 wherein the second means alters the amplitudes of the first and second phase voltages by a substantially equivalent amount.

3. The apparatus of claim 1 wherein the third means alters the amplitudes of the first and second phase voltages by a substantially equivalent amount with respect to a neutral connection.

4. The apparatus of claim 1 further comprising a mode selection switch for selecting between the first means, second means and third means, where the first means is selected when the mode selection switch is in a first position, the second means is selected when the mode selection switch is in a second position, and the third means is selected when the mode selection switch is in a third position.

5. The apparatus of claim 4 further comprising a phase selection switch for selecting to introduce a voltage disturbance between the first and second phase voltages when the phase selection switch is in a first position, for selecting to introduce a voltage disturbance between the second and third phase voltages when the phase selection switch is in a second position, and for selecting to introduce a voltage disturbance between the first and third phase voltages when the phase selection switch is in a third position.

6. The apparatus of claim 1 further comprising:

the input connections comprising a first input connection for connecting to and receiving the first phase voltage;

the output connections comprising a first output connection for connecting to the load and providing to the load the first phase voltage as altered by any one of the first means, second means and third means;

a first transformer having at least one tap connection and first and second winding connections, where the first winding connection is selectively coupled to the first input connection; and a first voltage switching network comprising:

a first switching device connected between the first input connection and the first output connection; and a second switching device connected between the tap connection and the first output connection.

7. The apparatus of claim 6 wherein the first voltage switching network further comprises a third switching device connected in parallel with the first switching device.

8. The apparatus of claim 7 wherein the first voltage switching network further comprises a first relay connected in parallel with the first and third switching devices.

9. The apparatus of claim 7 wherein the third switching device comprises a silicon controlled rectifier.

10. The apparatus of claim 6 wherein the first voltage switching network further comprises a second relay connected between and in series with the first switching device and the first input connection.

11. The apparatus of claim 6 wherein the first voltage switching network further comprises a third relay connected between and in series with the second switching device and the tap connection.

12. The apparatus of claim 6 wherein the first and second switching devices comprises insulated gate bipolar transistors.

13. An apparatus for selectively generating a disturbance in a three-phase supply voltage provided to a load, the apparatus comprising:

input connections disposed within a housing for connecting to and receiving three phase voltages of the three-phase supply voltage;

a voltage disturbance generator disposed within the housing for receiving the three phase voltages from the input connections and for selectively adjusting the amplitudes of one or more of the three phase voltages according to any one of a first test method, a second test method and a third test method, the voltage disturbance generator comprising:

first means for introducing a phase-to-phase voltage disturbance between any two of the phase voltages by altering the amplitude of one of the two phase voltages with reference to the amplitude of the other one of the two phase voltages according to the first test method, second means for introducing a phase-to-phase voltage disturbance between any two of the phase voltages by altering the amplitude of both of the two phase voltages by a substantially equivalent amount in reference to each other according to the second test method, and third means for introducing a voltage disturbance in any two of the phase voltages by altering the amplitude of both of the two phase voltages by a substantially equivalent amount in reference to a neutral connection according to the third test method;

output connections disposed within the housing for connecting to the load and providing to the load the three phase voltages as altered by the voltage disturbance generator; and one or more switches disposed within the housing for switching between the first means, second means and third means.

14. An apparatus for selectively generating a disturbance in a three-phase supply voltage provided to a load during a test, the apparatus comprising:
- input connections comprising a first input connection for connecting to and receiving a first phase voltage, a second input connection for connecting to and receiving a second phase voltage, and a third input connection for connecting to and receiving a third phase voltage of the three-phase supply voltage;
- output connections comprising a first output connection for connecting to the load and providing to the load the first phase voltage as altered during the test, a second output connection for connecting to the load and providing to the load the second phase voltage as altered during the test, and a third output connection for connecting to the load and providing to the load the third phase voltage as altered during the test; and
- a voltage disturbance generator for receiving the first, second and third phase voltages from the input connections and for selectively adjusting the amplitudes of one or more of the first, second and third phase voltages, the voltage disturbance generator comprising:
  - a first transformer comprising:
    - a first winding connection connected to the first input connection;
    - a second winding connection connected to the second input connection;
    - a first tap connection connected to the first output connection; and
    - a second tap connection connected to the second output connection.

15. The apparatus of claim 14 further comprising the third input connection connected to the third output connection.

16. The apparatus of claim 14 further comprising:
- a neutral connection;
- the first transformer including a center tap connected to the neutral connection; and
- a second transformer comprising:
  - a third winding connection connected to the third input connection;
  - a fourth winding connection connected to the neutral connection; and
  - a third tap connection connected to the third output connection.

17. The apparatus of claim 16 further comprising:
- a first voltage switching network connected between the first output connection and the first tap connection of the first transformer;
- a second voltage switching network connected between the second output connection and the second tap connection of the first transformer; and
- a third voltage switching network connected between the third output connection and the third tap connection of the second transformer.

18. The apparatus of claim 17 further comprising:
- the first voltage switching network connected between the first input connection and the first winding connection of the first transformer;
- the second voltage switching network connected between the second input connection and the second winding connection of the first transformer; and
- a third voltage switching network connected between the third input connection and the third winding connection of the second transformer.

19. An apparatus for selectively generating a disturbance in a supply voltage provided to a load during a test, the apparatus comprising:
- at least one input connection for receiving the supply voltage;
- at least one output connection for connecting to the load and providing to the load the supply voltage as altered during the test;
- a voltage disturbance generator for receiving the supply voltage from the at least one input connection and for selectively adjusting the amplitude of the supply voltage, the voltage disturbance generator comprising:
  - at least one voltage switching network comprising:
    - a first switching device connected between the at least one input connection and the at least one output connection;
    - a first bridge rectifier circuit connected across the first switching device and between the at least one input connection and the at least one output connection;
    - a first bipolarized protection component connected between the at least one input connection and the at least one output connection for protecting the first switching device and the first bridge rectifier circuit from transient voltage damage; and
    - a first unipolarized protection component connected across the first switching device for protecting the first switching device from transient voltage damage.

20. The apparatus of claim 19 wherein the first switching device comprises an insulated gate bipolar transistor.

21. The apparatus of claim 19 wherein the first bipolarized protection component comprises a metal oxide varistor.

22. The apparatus of claim 19 further comprising:
- the first switching device including an input port and an output port; and
- the first unipolarized protection component comprising:
  - a diode having a diode input and a diode output, the diode output connected to the output port of the first switching device;
  - a first capacitor and a second capacitor connected in series between the input port of the first switching device and the diode input,
  - a first resistor connected in parallel with the first capacitor;
  - a second resistor connected in parallel with the second capacitor; and
  - a third resistor connected in parallel with the diode.

23. The apparatus of claim 19 wherein the voltage disturbance generator further comprises at least one transformer having at least one tap connection, and the at least one voltage switching network further comprises:
- a second switching device connected between the at least one tap connection and the at least one output connection;
- a second bridge rectifier circuit connected across the second switching device and between the at least one tap connection and the at least one output connection;
- a second bipolarized protection component connected between the at least one tap connection and the at least one output connection for protecting the second switching device and the second bridge rectifier circuit from transient voltage damage; and
- a second unipolarized protection component connected across the second switching device for protecting the second switching device from transient voltage damage.

* * * * *